United States Patent [19]
Sekiguchi

[11] Patent Number: 5,854,766
[45] Date of Patent: Dec. 29, 1998

[54] NON-VOLATILE SEMICONDUCTOR MEMORY DEVICE WITH DIAGNOSTIC POTENTIAL GENERATOR FOR INDIVIDUALLY CHECKING WHETHER MEMORY CELLS ARE OVER-ERASED

[75] Inventor: Mitsuru Sekiguchi, Tokyo, Japan

[73] Assignee: NEC Corporation, Tokyo, Japan

[21] Appl. No.: 855,601

[22] Filed: May 13, 1997

[30] Foreign Application Priority Data

May 13, 1996 [JP] Japan ................................. 8-142241

[51] Int. Cl.⁶ ........................................................ G11C 7/00
[52] U.S. Cl. .................. 365/218; 365/185.33; 365/185.3
[58] Field of Search ............................. 365/218, 185.33, 365/185.3

[56] References Cited

U.S. PATENT DOCUMENTS

| 4,841,482 | 6/1989 | Kreifels et al. ...................... 365/185 |
| 5,237,535 | 8/1993 | Meilke et al. ........................ 365/218 |
| 5,287,317 | 2/1994 | Kobayashi et al. ................... 385/218 |
| 5,347,490 | 9/1994 | Terada et al. ........................ 365/218 |
| 5,554,868 | 9/1996 | Hayashikoshi et al. .............. 385/218 |

*Primary Examiner*—David Nelms
*Assistant Examiner*—David Lam
*Attorney, Agent, or Firm*—Foley & Lardner

[57] ABSTRACT

When floating gate type memory transistors undesirably enter into an over-erased state, a diagnostic potential generator supplies a first diagnostic potential to a source line and second and third diagnostic potentials to non-selected word lines and a selected word line; the potential difference between the first diagnostic potential and the second diagnostic potential causes an over-erased memory transistor to be turned off, and the potential difference between the first diagnostic potential and the third diagnostic potential allows an over-erased memory transistor to turn on so as to identify each over-erased memory transistor by its row and column addresses.

9 Claims, 5 Drawing Sheets

NON-VOLATILE SEMICONDUCTOR MEMORY DEVICE WITH DIAGNOSTIC POTENTIAL GENERATOR FOR INDIVIDUALLY CHECKING WHETHER MEMORY CELLS ARE OVER-ERASED

FIELD OF THE INVENTION

This invention relates to a non-volatile semiconductor memory device and, more particularly, to an electrically erasable and programmable read only memory device having a diagnostic potential generator for individually checking whether floating gate type memory transistors over erased.

DESCRIPTION OF THE RELATED ART

An electrically erasable and programmable read only memory device that as is a semiconductor memory device electrically rewritable and that stores data without electric power. A typical example of electrically erasable and programmable read only memory device is illustrated in FIG. 1 of the drawings, and generally comprises a memory cell array 1, an addressing block 2, a data read/write block 3, a controlling circuit 4 and a data erasing circuit (not shown).

A plurality of n-channel floating gate type field effect transistors are arranged in rows and columns, and form the memory cell array 1. The n-channel floating gate type field effect transistor has a floating gate electrode and a control gate electrode stacked over a channel region, and electrons are accumulated in and evacuated from the floating gate electrode. The threshold of the n-channel floating gate type field effect transistor is variable depending upon the amount of electrons in the floating gate electrode, and a high threshold and a low threshold represent two logic levels of a data bit.

A plurality of bit lines DL1, DL2, . . . , DLm and DLn are selectively connected to the drain nodes of the plurality of n-channel floating gate type field effect transistors, and a plurality of word lines WL1, . . . and WLm are selectively connected to the control gate electrodes of the plurality of n-channel floating gate type field effect transistors. Row addresses and column addresses are assigned to the plurality of word lines WL1 to WLm and the plurality of bit lines DL1 to DLn, and each of the plurality of n-channel floating gate type field effect transistors is specified with the row address and the column address.

The addressing block 2 is broken down into a row addressing sub-block 2a and a column addressing sub-system 2b. The row addressing sub-block 2a includes an address buffer circuit 2c connected to address pins A1 to Ai and a row address decoder 2d connected between the address buffer circuit 2c and the word lines WL1 to WLm. A row address signal is supplied to the address pins A1 to Ai, and is representative of a row address. The row address signal is coded by the address buffer circuit 2c, and a row address coded signal is supplied from the address buffer circuit 2c to the row address decoder 2d. The row address decoded signal still represents the row address, and the row address decoder 2d selects one of the word lines WL1 to WLm assigned the row address.

On the other hand, the column addressing sub-block 2b includes an address buffer/decoder circuit 2e connected to address pins Aj to Ax and column selecting transistor array 2f connected to the bit lines DL1 to DLn. A column address signal representative of a column address is supplied to the address pins Aj to Ax, and is transferred to the address buffer/decoder circuit 2e. The address buffer/decoder circuit 2e causes the column selecting transistor array 2f to selectively turn on, and the column selecting transistor array 2f becomes transparent to the bit line assigned the column address.

The data read/write block 3 includes a data buffer circuit 3a connected to a data pin Dp, a write-in circuit 3b connected between the data buffer circuit 3a and the column selecting transistor array 2f and a sense amplifier 3c also connected between the column selecting transistor array 2f and the data buffer circuit 3a. A read-out data bit is transferred from a selected bit line through the column selecting transistor array 2f to the sense amplifier 3c, and the sense amplifier 3c rapidly decides the logic level of the read-out data bit. The sense amplifier 3c transfers the read-out data bit to the data buffer circuit 3a, and an output data signal Dout is delivered from the data pin Dp. On the other hand, when an input data signal Din representative of a write-in data bit is supplied to the data pin Dp, the write-in data bit is supplied from the data buffer circuit 3a to the write-in circuit 3b, and produces a write-in potential or a non-write-in potential depending upon the logic level of the write-in data bit. The write-in potential or the non-write-in potential is supplied through the column selecting transistor array 2f to the selected bit line.

The controlling circuit 4 is connected to a power-supply pin Vpp and control signal pins CE and OE, and controls the addressing block 2 and the data read/write block 3. The write-in potential is supplied to the power supply pin Vpp, and a chip enable signal and an output enable signal are supplied to the control signal pins CE and OE. The controlling circuit 4 is responsive to the chip enable signal for activating the addressing block 2, and selectively establishes the data path between the bit lines DL1 to DLn and the data buffer circuit 3a depending upon the logic level of the output enable signal.

FIG. 2 illustrates the data path established between the bit lines DL1 to DLn and the sense amplifier 3c during a data read-out. A current comparator 3d and a reference current generator 3e form in combination the sense amplifier 3c, and the reference current generator 3e is implemented by a series of n-channel enhancement type field effect transistor Qn1 and an n-channel floating gate type field effect transistor FQn1. The series circuit Qn1/FQn1 is coupled between the current comparator 3d and a ground line GND, and a positive power voltage level Vcc is supplied to the gate electrode of the n-channel enhancement type field effect transistor Qn1 and the control gate electrode of the n-channel floating gate type field effect transistor FQn1. The n-channel floating gate type field effect transistor FQn1 is equivalent to the n-channel floating gate type field effect transistor of the memory cell array 1, and reference current Ir flows through the series of n-channel enhancement type field effect transistor Qn1 and the n-channel floating gate type field effect transistor FQn1 to the ground line GND.

The column selecting transistor array 2f includes a plurality of n-channel enhancement type switching transistors Qn11 to Qn1n connected in parallel between the current comparator 3d and the associated bit lines DL1 to DLn, and the plurality of n-channel floating gate type field effect transistors MC11 to MC1n, . . . and MCm1 to MCmn are selectively connected between the bit lines DL1 to DLn and a source line SL. The source line SL is connected to the ground line during the data read-out, and is connected to the erasing circuit during a data erasing.

Assuming now that the n-channel floating gate type field effect transistor MC11 is selected from the memory cell array 1, the word line WL1 is changed to the positive power voltage level Vcc and the other word lines remain in the ground level. A control signal y1 of the positive power voltage level Vcc is supplied to the n-channel enhancement type switching transistor Qn11, and the other control signals such as ym remain in the ground level. As a result, only the n-channel enhancement type switching transistor Qn11 turns on, and the current comparator 3d is electrically connectable through the n-channel enhancement type switching transistor Qn11 and the n-channel floating gate type field effect transistor MC11 to the source line SL.

If the n-channel floating gate type field effect transistor MC11 has a high threshold of the order of 9 volts much higher than the positive power voltage Vcc at 5 volts, the n-channel floating gate type field effect transistor MC11 is turned off, and no current flows from the current comparator 3d. The current comparator 3d decides the logic level of the data bit stored in the n-channel floating gate type field effect transistor MC11 to be one of the logic levels corresponding to the high threshold through the comparison with the reference current Ir, and supplies a read-out data signal Sout to the data buffer circuit 3a.

On the other hand, if the n-channel floating gate type field effect transistor MC11 has a low threshold between 1 volt and 2 volts, the n-channel floating gate type field effect transistor MC11 turns on, and current In flows from the current comparator 3d to the source line SL. The current comparator decides the logic level of the data bit stored in the n-channel floating gate type field effect transistor MC11 to be the other of the logic levels corresponding to the low threshold through the comparison with the reference current Ir, and supplies the read-out data signal Sout to the data buffer circuit 3a. Thus, the logic level of the read-out data bit directly relates to the threshold of the n-channel floating gate type field effect transistor, and the threshold is expected to be changed across the positive power voltage level Vcc.

The data write-in is usually carried out after the data erasing. The electrons are evacuated from the floating gate electrodes of the n-channel floating gate type field effect transistors to the source line SL during the erasing. If the evacuation is exactly controlled, the threshold ranges between 1 volt and 2 volts. However, when the n-channel floating gate type field effect transistor is excessively erased, the threshold is decreased to a negative voltage. This phenomenon is known as "over-erase". After the entry into the over-erased state, even if electrons are injected into the floating gate electrode, the threshold does not exceed the positive power voltage Vcc, and the n-channel floating gate-type field effect transistor stores a false data bit opposite in logic level to the correct data bit.

U.S. Pat. No. 4,841,482 discloses a diagnosing technology to see what bit line is connected to a memory cell in the over-erased state. All of the word lines are changed to the ground level, and the bit lines are sequentially selected so as to see whether or not current flows from the selected bit line. If there is a memory cell in the over-erased state, the memory cell allows the current to flow therethrough, and the sense amplifier changes the logic level of the read-out data bit corresponding to Sout.

U.S. Pat. No. 5,237,535 proposes to recover a memory cell from the over-erased state. The memory cell in the over-erased state is found through the sequential check similar to that of U.S. Pat. No. 4,841,482. If a memory cell is diagnosed to be in the over-erased state, a small amount of electrons is injected into the floating gate electrode of the over-erased memory cell so as to recover it from the over-erased state.

The prior art electrically erasable and programmable read only memory device disclosed in U.S. Pat. No. 4,841,482 merely decides the bit line connected to the over-erased memory cell; however, it is impossible to identify what memory cell on the bit line is in the over-erased state.

Although the prior art electrically erasable and programmable read only memory device disclosed in U.S. Pat. No. 5,237,535 can recover the memory cell from the over-erased state, the injection of electrons affects other memory cells, and undesirably increases the thresholds of the other memory cells.

SUMMARY OF THE INVENTION

It is therefore an important object of the present invention to provide an electrically erasable and programmable read only memory device which specifies addresses assigned to each over-erased memory cell.

To accomplish the object, the present invention proposes to regulate a gate-to-source potential to a certain value individually allowing over-erased memory transistors to turn on.

In accordance with the present invention, there is provided an electrically erasable and programmable read only memory device comprising a memory cell array including a plurality of memory transistors, each of the plurality of memory transistors having a variable threshold and storing a data bit of one of first and second logic levels corresponding to first and second thresholds, respectively, a plurality of bit lines selectively connected to current input nodes of the plurality of memory transistors, a plurality of word lines selectively connected to control nodes of the plurality of memory transistors so as to select memory transistors from said memory cell array, a current discharging path connected to discharging nodes of the plurality of memory transistors, a data logic level discriminating means selectively connected to the plurality of bit lines and determining whether each of the memory transistors has the first threshold or the second threshold on the basis of the amount of current passing through the aforesaid each of the memory transistors, and an over-erased state discriminating means supplying a first diagnostic potential level to the discharging path and sequentially changing the plurality of word lines from a second diagnostic potential level to a third diagnostic potential level so as to cause the data logic level discriminating means to see whether or not each of the plurality of memory transistors has entered into over-erased state represented by a third threshold that is outside of a potential range between the first threshold and the second threshold, a potential difference between the first diagnostic potential level and the second diagnostic potential level causing each of the plurality of memory transistors in the over-erased state to be turned off, and a potential difference between the first diagnostic potential level and the third diagnostic potential level allows each of the plurality of memory transistors in the over-erased state to turn on.

BRIEF DESCRIPTION OF THE DRAWINGS

The features and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 1:
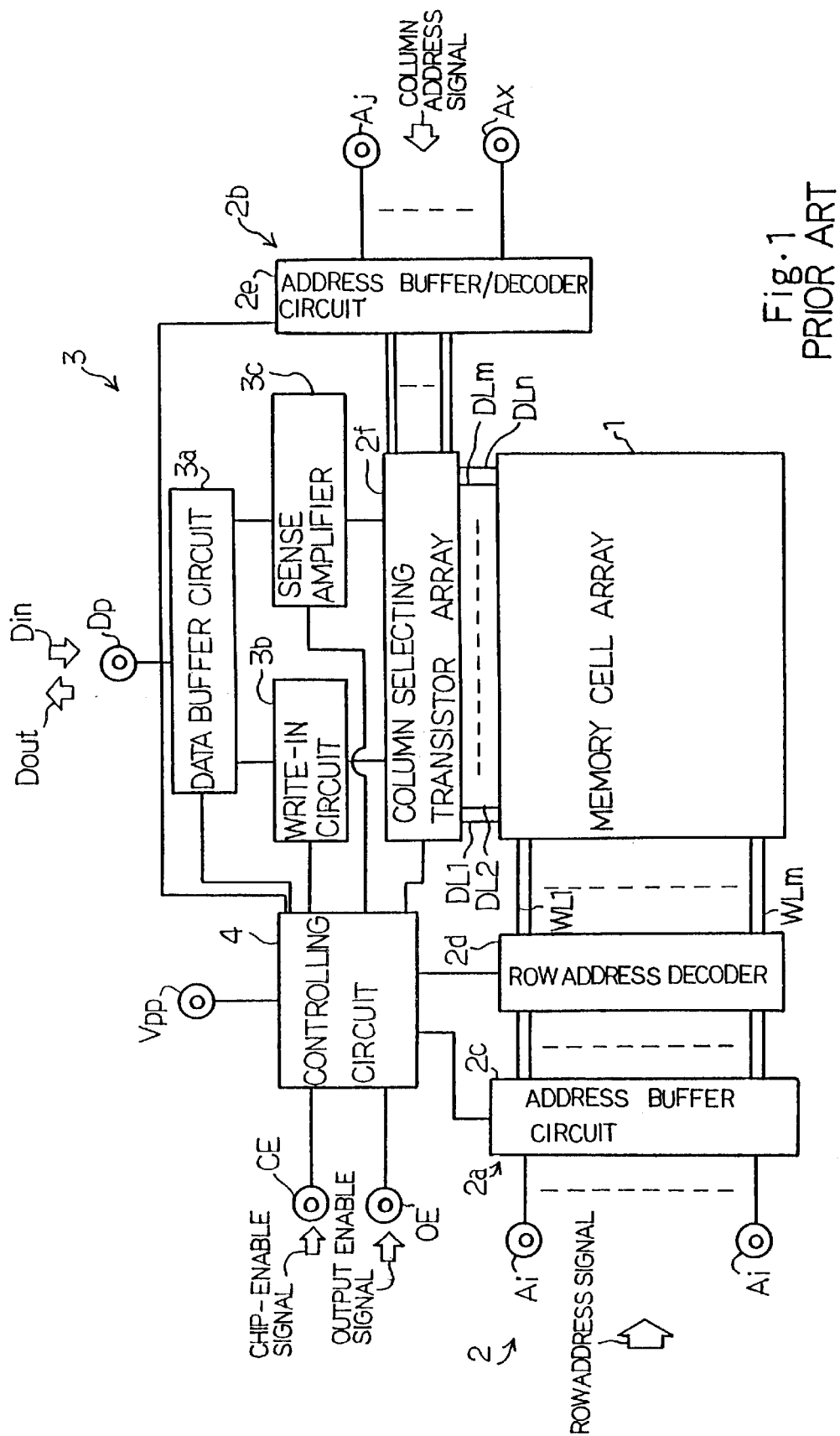
FIG. 1 is a block diagram showing the arrangement of the prior art electrically erasable and programmable read only memory device.
Figure 2:
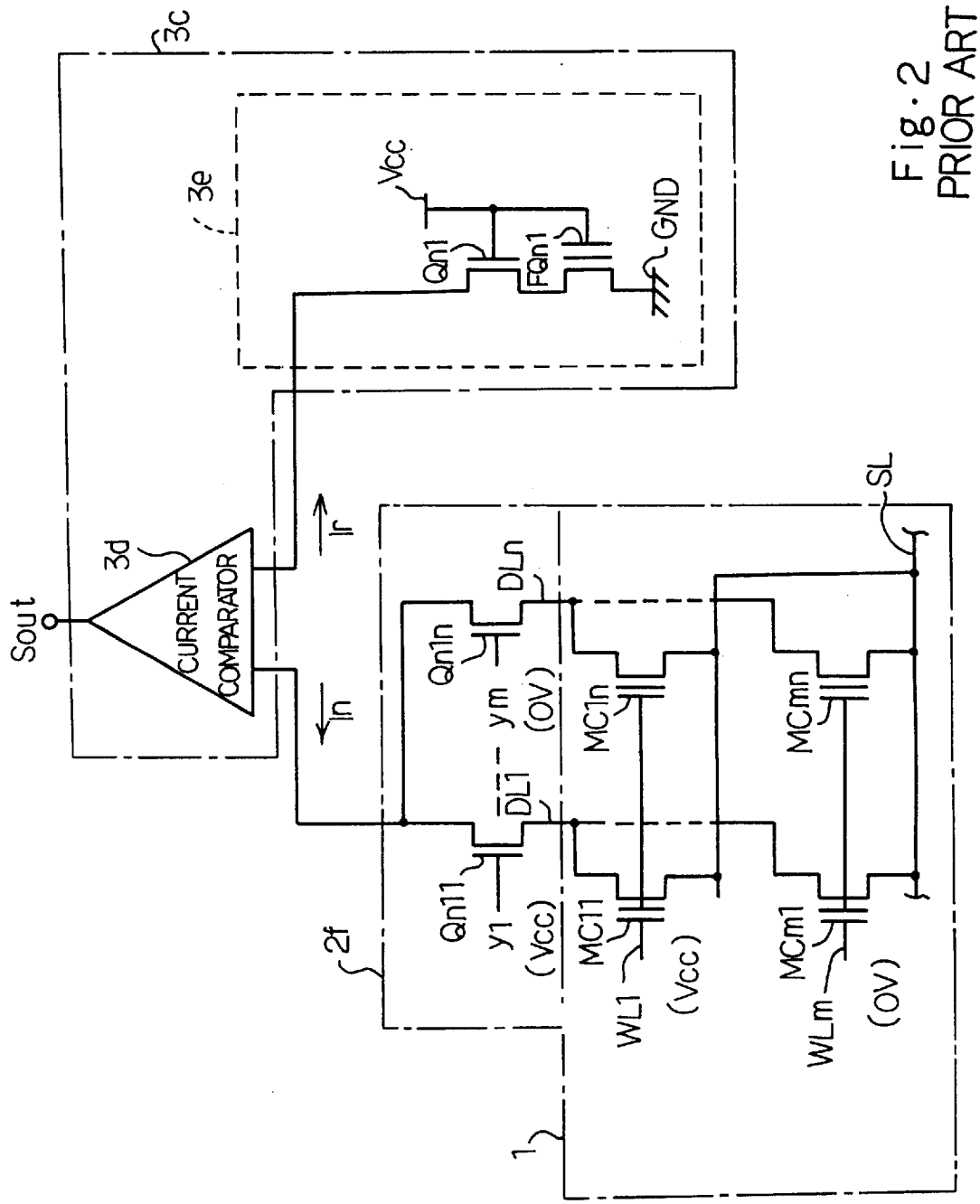
FIG. 2 is a circuit diagram showing a data path of the prior art electrically erasable and programmable read only memory device during the data read-out.
Figure 3:
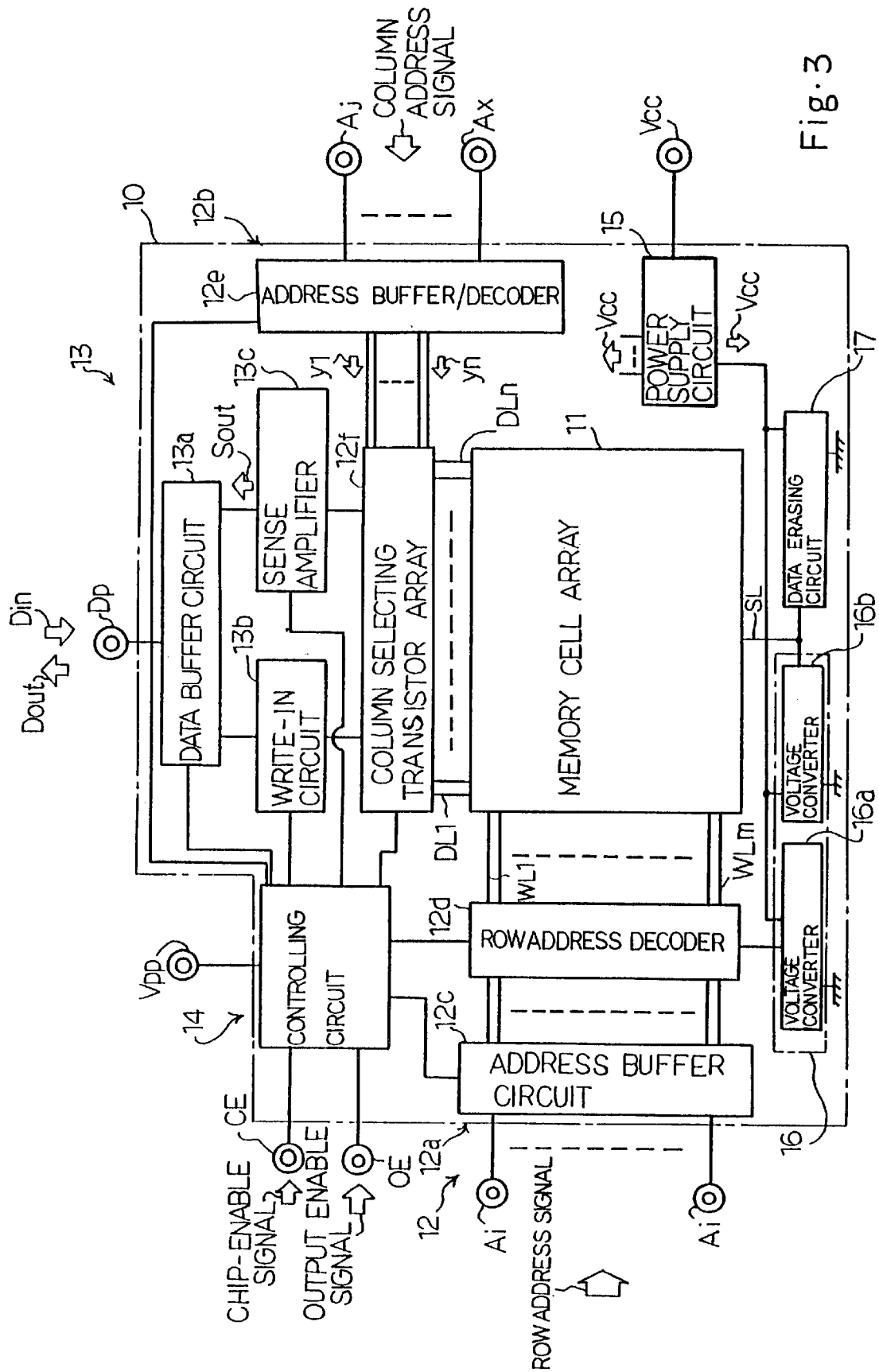
FIG. 3 is a block diagram showing the arrangement of an electrically erasable and programmable read only memory device according to the present invention.

Referring to FIG. 3 of the drawings, an electrically erasable and programmable read only memory device is fabricated on a semiconductor chip 10, and generally comprises a memory cell array 11, an addressing block 12, a data read/write block 13, a controlling circuit 14, a power supply circuit 15, a diagnostic potential generating block 16 and a data erasing circuit 17.

Figure 4:
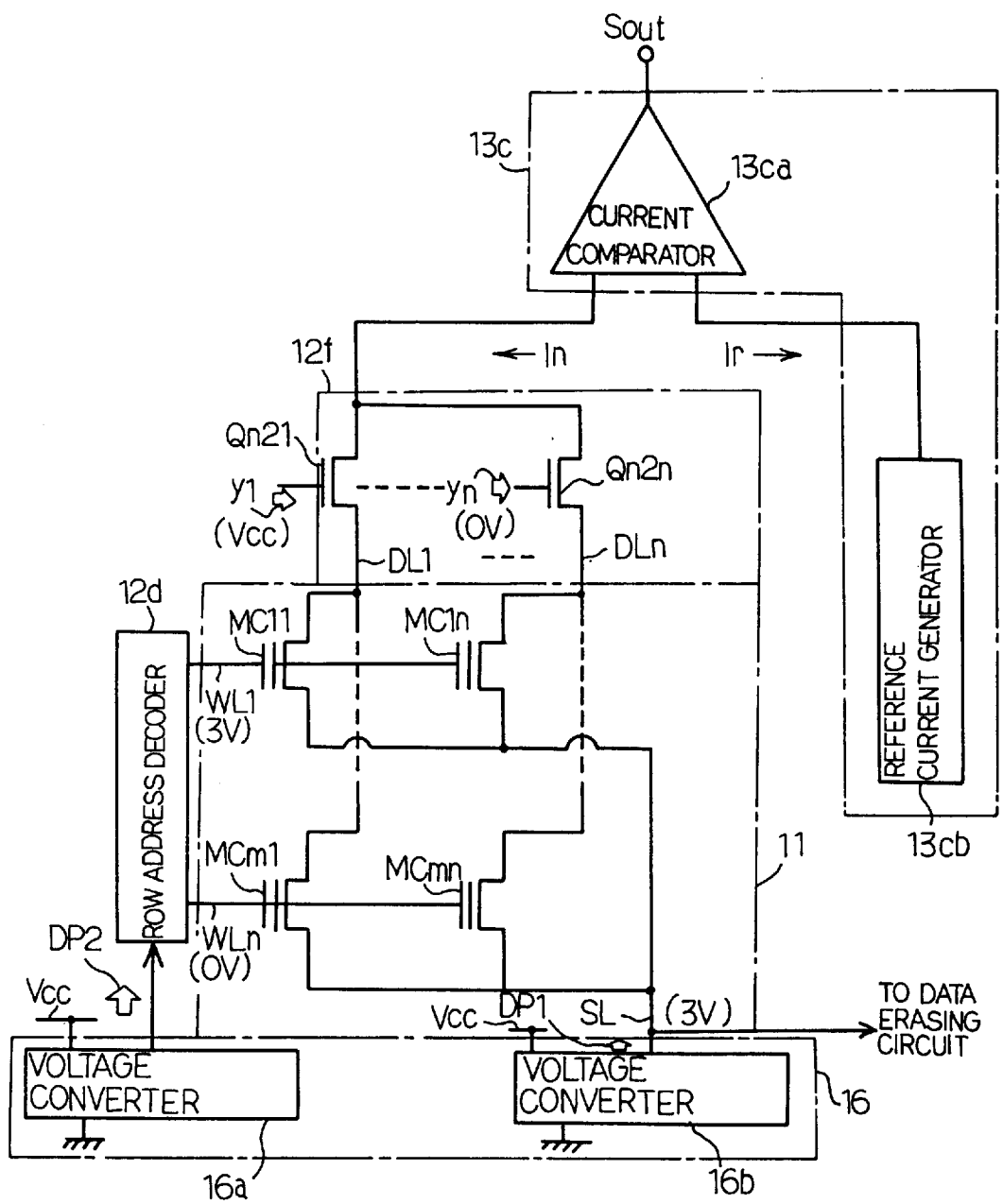
FIG. 4 is a circuit diagram showing a data path of the electrically erasable and programmable read only memory device during a data read-out.

A plurality of n-channel floating gate type memory transistors MC11-MC1n, . . . and MCm1-MCmn are arranged in rows and columns as shown in FIG. 4, and form the memory cell array 11. The n-channel floating gate type memory transistor MC11 to MCmn has a floating gate electrode and a control gate electrode stacked over a channel region, and electrons are accumulated in and evacuated from the floating gate electrode. The threshold of the n-channel floating gate type memory transistor is variable depending upon the amount of electrons accumulated in the floating gate electrode, and a high threshold and a low threshold represent two logic levels of a data bit.

A source line SL is connected to the source nodes of the plurality of n-channel floating gate type memory transistors MC11 to MCmn, and the source line SL is connected to the diagnostic potential generating block 16 and the data erasing circuit 17.

A plurality of bit lines DL1, . . . and DLn are selectively connected to the drain nodes of the plurality of n-channel floating gate type memory transistors MC11 to MCmn, and a plurality of word lines WL1, . . . and WLm are selectively connected to the control gate electrodes of the plurality of n-channel floating gate type memory transistors MC11 to MCmn.

Row addresses and column addresses are assigned to the plurality of word lines WL1 to WLm and the plurality of bit lines DL1 to DLn, and the row address and the column address specifies one of the plurality of n-channel floating gate type memory transistors MC11 to MCmn.

Turning to FIG. 3, the addressing block 12 is broken down into a row addressing sub-block 12a and a column addressing sub-system 12b. The row addressing sub-block 12a includes an address buffer circuit 12c connected to address pins A1 to Ai and a row address decoder 12d connected between the address buffer circuit 12c and the word lines WL1 to WLm.

A row address signal is supplied to the address pins A1 to Ai, and is representative of a row address. The row address signal is predecoded by the address buffer circuit 12c, and a row address coded signal is supplied from the address buffer circuit 12c to the row address decoder 12d. The row address decoded signal still represents the row address, and the row address decoder 12d selects one of the word lines WL1 to WLm assigned the row address.

On the other hand, the column addressing sub-block 12b includes an address buffer/decoder circuit 12e connected to address pins Aj to Ax and column selecting transistor array 12f connected between the bit lines DL1 to DLn and the data read-write block 13, and the column selecting transistor array 12f is implemented by a plurality of n-channel enhancement type transfer transistors Qn21 to Qn2n (see FIG. 4) arranged in parallel. The n-channel enhancement type transfer transistors Qn21 to Qn2n provide respective conduction paths connected to the bit lines DL1 to DLn, respectively, and the gate electrodes are connected to the address buffer/decoder circuit 12e.

A column address signal representative of a column address is supplied to the address pins Aj to Ax, and is decoded by the address buffer/decoder circuit 12e. The address buffer/decoder circuit 12e supplies a column address decoded signal y1 to yn to the column selecting transistor array 12f, and the column address decoded signal y1 to yn causes the n-channel enhancement type transfer transistors Qn21 to Qn2n to selectively turn on. Thus, the column addressing sub-block 12b selectively connects the bit lines DL1 to DLn to the data read/write block 13.

The data read/write block 13 includes a data buffer circuit 13a connected to a data pin Dp, a write-in circuit 13b connected between the data buffer circuit 13a and the column selecting transistor array 12f and a sense amplifier 13c also connected between the column selecting transistor array 12f and the data buffer circuit 13a.

A current comparator 13ca and a reference current generator 13cb as a whole constitute the sense amplifier 13c as shown in FIG. 4. The reference current generator 13cb is similar in circuit arrangement to the reference current generator 3e, and allows reference current Ir to flow therethrough. The current comparator compares current flowing into the column selecting transistor array 12f with the reference current Ir, and determines the logic level of a data bit stored in a selected n-channel floating gate type memory transistor.

A read-out data bit is transferred from a selected bit line through the column selecting transistor array 12f to the sense amplifier 13c, and the sense amplifier 13c rapidly determines the logic level of the read-out data bit. The sense amplifier 13c transfers the read-out data bit Sout to the data buffer circuit 13a, and an output data signal Dout is delivered from the data buffer circuit 13a to the data pin Dp.

On the other hand, when an input data signal Din representative of a write-in data bit is supplied to the data pin Dp, the write-in data bit is supplied from the data buffer circuit 13a to the write-in circuit 13b, and produces a write-in potential Vpp or a non-write-in potential depending upon the logic level of the write-in data bit. The write-in potential Vpp or the non-write-in potential is supplied through the column selecting transistor array 12f to the selected bit line. The write-in potential Vpp is higher than a positive power voltage level Vcc, and the non-write-in potential is usually ground level.

The power supply circuit 15 is connected to a power supply pin VCC, and the positive power voltage Vcc of 5 volts is distributed from the power supply circuit 15 to the addressing block 12, the data read/write block 13, the diagnostic potential generating block 16 and the data erasing circuit 17.

The diagnostic potential generating block 16 includes two voltage converters 16a and 16b powered with the positive power voltage Vcc. The voltage converter 16b produces a first diagnostic potential DP1 from the positive power voltage Vcc, and the first diagnostic potential DP1 is supplied to the source line SL. In this instance, the voltage converter 16a produces a second diagnostic potential is at ground level. The voltage converter 16a also produces a third diagnostic potential DP2 from the positive power voltage Vcc, and supplies the third diagnostic potential DP2 to the row address decoder 12d. In this instance, both first and second diagnostic potentials DP1 and DP2 are regulated to 3 volts.

The controlling circuit 14 is connected to a power-supply pin VPP and control signal pins CE and OE, and controls the addressing block 12, the data read/write block 13, the diagnostic potential generating block 16 and the data erasing circuit 17. The write-in potential Vpp is supplied to the power supply pin VPP, and a chip enable signal and an output enable signal are supplied to the control signal pins CE and OE.

The write-in potential Vpp is supplied to the row address decoder 12d, the write-in circuit 13b and the address buffer/decoder circuit 12e during a write-in operation.

The controlling circuit 14 is responsive to the chip enable signal for activating the addressing block 12, and selectively establishes the data path between the bit lines DL1 to DLn and the data buffer circuit 13a depending upon the logic level of the output enable signal.

The write-in potential Vpp is supplied to the row address decoder 12d, the write-in circuit 13b and the address buffer/decoder circuit 12e during a write-in operation.

The electrically erasable and programmable read only memory device selectively enters into an erasing operation, a write-in operation, a read-out operation and a diagnosing operation.

The erasing operation and the write-in operation does not directly concern to the present invention, and are similar to those of the prior art electrically erasable and programmable read only memory device. For this reason, description is focused on the read-out operation and the diagnosing operation.

First, the read-out operation is described. Assuming now that the n-channel floating gate type memory transistor MC11 is selected from the memory cell array 11, the word line WL1 is changed to the positive power voltage level Vcc and the other word lines remain in the ground level. The address buffer/decoder circuit 12e changes the signal bit y1 of the column address decoded signal to the positive power voltage level Vcc, and remains other signal bits in the ground level. As a result, only the n-channel enhancement type switching transistor Qn21 turns on, and the current comparator 13ca is electrically connectable through the n-channel enhancement type switching transistor Qn21 and the n-channel floating gate type memory transistor MC11 to the source line SL.

If the n-channel floating gate type field effect transistor MC11 has a high threshold, for example, of the order of 9 volts higher than the positive power voltage Vcc, the n-channel floating gate type memory transistor MC11 is turned off, and no current flows from the current comparator 13ca to the source line SL. The current comparator 13ca decides the logic level of the data bit stored in the n-channel floating gate type memory transistor MC11 to be one of the logic levels corresponding to the high threshold through the comparison with the reference current Ir, and supplies the read-out data signal Sout to the data buffer circuit 13a.

On the other hand, if the n-channel floating gate type field effect transistor MC11 has a low threshold between 1 volt and 2 volts, the n-channel floating gate type field effect transistor MC11 turns on, and current In flows from the current comparator 13ca to the source line SL. The current comparator 13ca decides the logic level of the data bit stored in the n-channel floating gate type memory transistor MC11 to be the other of the logic levels corresponding to the low threshold through the comparison with the reference current Ir, and supplies the read-out data signal Sout of the opposite logic level to the data buffer circuit 13a.

After an erasing operation, the diagnostic operation is used. The controlling circuit 14 instructs the voltage converter 16b to supply the first diagnostic potential DP1 to the source line SL, and the first diagnostic potential DP1 is distributed to the source nodes of the n-channel floating gate type memory transistors MC11 to MCmn. The controlling circuit 14 further instructs the voltage converter 16a to supply the third diagnostic potential DP2 to the row address decoder 12d and the sense amplifier 13c to increase the potential of a source of current In/Ir to a certain level over the first diagnostic potential such as 4 volts. A testing system (not shown) causes the row address decoder 12d sequentially change the word lines WL1 to WLm from the second diagnostic potential, i.e., the ground level, to the third diagnostic potential level DP2.

In this instance, the criterion between the over-erased state and the non-over-erased state is selected to be zero volt. Therefore, the potential difference between the first diagnostic potential level DP1 and the second diagnostic potential is −3 volt, and not only a non-over-erased memory transistor but also an over-erased memory transistor is turned off. However, the potential difference between the first diagnostic potential level DP1 and the third diagnostic potential DP2 allows the over-erased memory transistor to turn on, and keeps the non-over-erased memory transistor in the off-state. Thus, even if more than one over-erased memory transistor is connected to one of the bit lines DL1 to DLn, the over-erased memory transistors are individually checked by the sense amplifier 13c.

When the row address decoder 12d selects the word line WL1 in the diagnostic operation, the word line WL1 is changed to 3 volts, and the other word lines such as WLm remain in the ground level as shown in FIG. 4. While the row address decoder 12d is applying the third diagnostic potential DP2 to the word line WL1, the testing system (not shown) sequentially changes the column address, and the column selecting transistor array 12f sequentially connects the bit lines DL1 to DLn to the sense amplifier 13c. The sense amplifier 13c sequentially checks the n-channel floating gate type memory transistors MC11 to MC1n to see whether or not the memory transistor has entered into the over-erased state. If one of the n-channel floating gate type memory transistors MC11 to MC1n is in the over-erased state, the current flows through the over-erased memory transistor, and the sense amplifier 13c changes the logic level of the read-out data signal-Sout. Then, the testing system determines the row address and the column address of the over-erased memory transistor.

The testing system may instructs the controlling circuit 14 to inject a small amount of electrons into the floating gate electrode of the over-erased memory transistor. The n-channel floating gate type memory transistor is recovered from the over-erased state, and the injection of electrons does not affect the other memory transistors.

In this instance, the source line SL serves as a current discharging path. The column addressing sub-block 12b and the sense amplifier 13c as a whole constitute a data logic level discriminating means, and the row addressing sub-block 12a and the diagnostic potential generating block 16 form in combination an over-erased state discriminating means.

The read-out operation and the diagnostic operation are summarized in the following table.

TABLE

|  | word line | Source line | Bit line |
|---|---|---|---|
| Selected cell in read-out | 5 volts | 0 volt | 1 volt |
| Non-selected cell in read-out | 0 volt | 0 volt | 1 volt |
| Selected cell in diagnosis | 3 volts | 3 volts | 4 volts |
| Non-selected cell in diagnosis | 0 volt | 3 volts | 4 volts |

As will be appreciated from the foregoing description, the diagnostic potential generating block supplies the first and third diagnostic potentials DP1 and DP2 to the source line SL and the row address decoder 12d so that the n-channel floating gate type memory transistors MC11 to MCmn are individually checked whether in the over-erased state or not. The injection of electrons is carried out for each of the over-erased memory transistors, and other memory transistors are not affected by the injection of electron.

Second Embodiment

Figure 5:
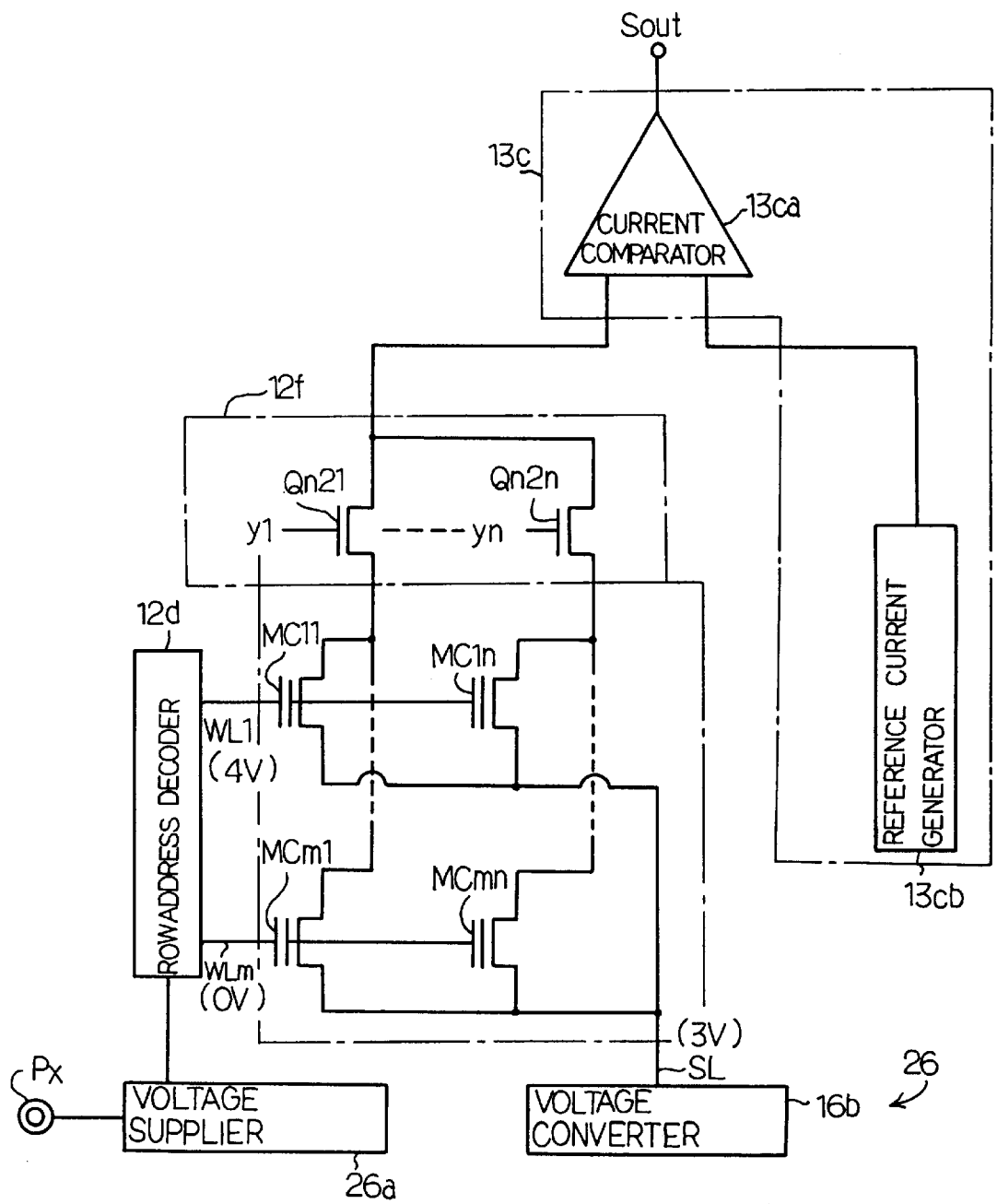
FIG. 5 is a circuit diagram showing a data path of another electrically erasable and programmable read only memory device during a data read-out.

FIG. 5 illustrates an essential part of another electrically erasable and programmable read only memory device embodying the present invention. The electrically erasable and programmable read only memory device shown in FIG. 5 is only different from the first embodiment in that a voltage supplier 26a transfers a third diagnostic potential of 4 volts from an external power voltage applied to a pin Px. However, the other circuit configuration is similar to those of the first embodiment, and, for this reason, the other circuit components are labeled with the same references designating the corresponding components of the first embodiment.

The external power voltage and, accordingly, the third diagnostic potential are variable, and a manufacturer can change a margin between the over-erased state and the non-over-erased state. The margin is, by way of example, variable between zero to 2.

Other circuit behavior is similar to the first embodiment, and the advantages of the first embodiment are also achieved by the second embodiment.

Although particular embodiments of the present invention have been shown and described, it will be obvious to those skilled in the art that various changes and modifications may be made without departing from the spirit and scope of the present invention.

For example, the memory cell array 11 may be divided into a plurality of memory cell sub-blocks, and the plurality of memory cell sub-blocks may be selectively erased and, thereafter, diagnosed. In this instance, the source lines are respectively provided for the plurality of memory cell sub-blocks, and the diagnostic potential generating block selectively supplies the first diagnostic potential DP1 to the source lines.

What is claimed is:

1. An electrically erasable and programmable read only memory device comprising:

a memory cell array including a plurality of memory transistors, each of said plurality of memory transistors having a variable threshold and storing a data bit having one of first and second logic levels corresponding to first and second thresholds, respectively;

a plurality of bit lines selectively connected to current input nodes of said plurality of memory transistors;

a plurality of word lines selectively connected to control nodes of said plurality of memory transistors for applying potentials to word lines of memory transistors of the memory cell array;

a current discharging path connected to discharging nodes of said plurality of memory transistors;

a data logic level discriminating means selectively connected to said plurality of bit lines, for determining whether a memory transistor associated with a selected bit line has said first threshold or said second threshold on the basis of an amount of current passing through the selected bit line; and an over-erased state discriminating means for supplying a first diagnostic potential to said discharging path, and for sequentially changing said plurality of word lines from a second diagnostic potential to a third diagnostic potential such that said data logic level discriminating means determines whether a memory transistor associated with a selected bit line and receiving said third diagnostic potential has entered into an over-erased state represented by a third threshold that is outside of a potential range between said first threshold and said second threshold, a potential difference between said first diagnostic potential level and said second diagnostic potential level causing a memory transistor in said over-erased state to be turned off, a potential difference between said first diagnostic potential level and said third diagnostic potential level allowing a memory transistor in said over-erased state to turn on.

2. The electrically erasable and programmable read only memory device as set forth in claim 1, wherein said over-erased state discriminating means comprises:

a row addressing means connected to said plurality of word lines and a source of said second diagnostic potential level, for selectively applying said second diagnostic potential level and said third diagnostic potential level to said plurality of word lines;

a first voltage supplier producing said first diagnostic potential from an internal power voltage for applying said first diagnostic potential to said current discharging path; and a second voltage supplier producing said third diagnostic potential from said internal power voltage for supplying said third diagnostic potential from said row addressing means.

3. The electrically erasable and programmable read only memory device as set forth in claim 1, wherein said over-erased state discriminating means comprises:

a row addressing means connected to said plurality of word lines and a source of said second diagnostic potential level, for selectively applying said second diagnostic potential and said third diagnostic potential to said plurality of word lines;

a first voltage supplier producing said first diagnostic potential from an internal power voltage for applying said first diagnostic potential to said current discharging path; and a second voltage supplier producing said third diagnostic potential from said internal power voltage for supplying said third diagnostic potential to said row addressing means, and wherein said data logic level discriminating means comprises:

a sense amplifier for comparing a current of a selected bit line with a reference current to determine whether a selected bit line is connected to a memory transistor in said over-erased state; and a column addressing means connected between said plurality of bit lines and said sense amplifier for connecting a selected bit line to said sense amplifier.

4. The electrically erasable and programmable read only memory device as set forth in claim 3, further comprising a write-in circuit connected to said column addressing means for injecting electric charge into a memory transistor in said over-erased state to recover said memory transistor from said over-erased state.

5. The electrically erasable and programmable read only memory device as set forth in claim 1, wherein said third diagnostic potential level is variable.

6. The electrically erasable and programmable read only memory device as set forth in claim 5, wherein said over-erased state discriminating means comprises:

a row addressing means connected to said plurality of word lines and a source of said second diagnostic potential level, for selectively applying said second diagnostic potential level and said third diagnostic potential level to said plurality of word lines;

a first voltage supplier producing said first diagnostic potential from an internal power voltage for applying said first diagnostic potential to said current discharging path; and a second voltage supplier producing said third diagnostic potential from said internal power voltage for supplying said third diagnostic potential from said row addressing means.

7. The electrically erasable and programmable read only memory device as set forth in claim 5, wherein said over-erased state discriminating means comprises:

row addressing means connected to said plurality of word lines and a source of said second diagnostic potential level, for selectively applying said second diagnostic potential and said third diagnostic potential to said plurality of word lines;

a first voltage supplier producing said first diagnostic potential from an internal power voltage for applying said first diagnostic potential to said current discharging path; and a second voltage supplier producing said third diagnostic potential from said internal power voltage for supplying said third diagnostic potential to said row addressing means, and wherein said data logic level discriminating means comprises:

a sense amplifier for comparing a current of a selected bit line with a reference current to determine whether a selected bit line is connected to a memory transistor in said over-erased state; and a column addressing means connected between said plurality of bit lines and said sense amplifier for connecting a selected bit line to said sense amplifier.

8. The electrically erasable and programmable read only memory device as set forth in claim 7, further comprising a write-in circuit connected to said column addressing means for injecting electric charge into a memory transistor in said over-erased state to recover said memory transistor from said over-erased state.

9. A method for determining whether a memory cell of a memory cell array is in an over-erased state, comprising:

applying a first diagnostic potential level to a discharging path associated with a memory cell;

applying a second diagnostic potential to a word line of the memory cell to cause the memory cell to be turned off if the memory cell is in an over-erased state;

changing the potential applied to the word line of the memory cell from the second diagnostic potential to a third diagnostic potential to cause the memory cell to be turned on if the memory cell is in an over-erased state; and detecting a change in a logic level of a bit line of the memory cell corresponding to the change from the second diagnostic potential to the third diagnostic potential.

* * * * *